(12) United States Patent
Sumida et al.

(10) Patent No.: US 10,286,860 B2
(45) Date of Patent: May 14, 2019

(54) ELECTRICITY STORAGE UNIT

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

(72) Inventors: Tatsuya Sumida, Mie (JP); Kyohei Morita, Mie (JP); Kazuhide Kitagawa, Mie (JP); Hisao Hattori, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/541,230

(22) PCT Filed: Dec. 18, 2015

(86) PCT No.: PCT/JP2015/085536
§ 371 (c)(1),
(2) Date: Jun. 30, 2017

(87) PCT Pub. No.: WO2016/111143
PCT Pub. Date: Jul. 14, 2016

(65) Prior Publication Data
US 2017/0341607 A1 Nov. 30, 2017

(30) Foreign Application Priority Data
Jan. 7, 2015 (JP) .................................. 2015-001363

(51) Int. Cl.
*H05K 7/20* (2006.01)
*B60R 16/023* (2006.01)
(Continued)

(52) U.S. Cl.
CPC ...... *B60R 16/0239* (2013.01); *B60L 11/1874* (2013.01); *B60L 11/1879* (2013.01);
(Continued)

(58) Field of Classification Search
CPC .................................... H05K 7/2089–7/20945
See application file for complete search history.

(56) References Cited

U.S. PATENT DOCUMENTS 7,167,377 B2 * 1/2007 Onizuka .............. H05K 1/0263
361/772
7,427,851 B2 * 9/2008 Takemoto ............. B60R 16/023
320/150
(Continued)

FOREIGN PATENT DOCUMENTS

JP 2003164039 A 6/2003
JP 2005-094943 4/2005
(Continued)

OTHER PUBLICATIONS

Search Report for PCT/JP2015/085536, dated Mar. 15, 2016.

*Primary Examiner* — Robert J Hoffberg
(74) *Attorney, Agent, or Firm* — Honigman LLP

(57) ABSTRACT

The present invention provides an electricity storage unit in which the influence of noise from a circuit portion can be suppressed, and the circuit portion and a power storage element can be consolidated. The electricity storage unit includes a circuit portion on which an electronic component is mounted, power storage elements, and a holding member that holds the power storage elements. The holding member includes an electrically conductive shield wall portion between the circuit portion and the power storage elements, and the shield wall portion shields noise generated by the circuit portion. The electricity storage unit may further have
(Continued)

an electrically conductive heat dissipation member that dissipates heat from the circuit portion.

4 Claims, 17 Drawing Sheets

(51) Int. Cl.
*H02G 3/08* (2006.01)
*H05K 9/00* (2006.01)
*H01G 11/10* (2013.01)
*H02J 7/34* (2006.01)
*H05K 7/14* (2006.01)
*B60L 11/18* (2006.01)
*H02M 7/00* (2006.01)
*H02J 7/00* (2006.01)

(52) U.S. Cl.
CPC .............. *H01G 11/10* (2013.01); *H02G 3/08* (2013.01); *H02J 7/0042* (2013.01); *H02J 7/345* (2013.01); *H02M 7/003* (2013.01); *H05K 7/1432* (2013.01); *H05K 7/20854* (2013.01); *H05K 9/0003* (2013.01); *B60L 2240/545* (2013.01); *Y02T 10/7005* (2013.01); *Y02T 10/705* (2013.01)

(56) References Cited

U.S. PATENT DOCUMENTS

| | | | | |
|---|---|---|---|---|
| 8,058,842 | B2* | 11/2011 | Kai | B60L 11/1861 |
| | | | | 320/116 |
| 8,587,977 | B2* | 11/2013 | Nishikimi | H05K 7/20927 |
| | | | | 361/679.46 |
| 8,699,254 | B2* | 4/2014 | Nishikimi | H05K 7/20927 |
| | | | | 361/271 |
| 8,717,760 | B2* | 5/2014 | Iguchi | H05K 7/20927 |
| | | | | 165/80.4 |
| 8,902,623 | B2* | 12/2014 | Nishikimi | H05K 7/20927 |
| | | | | 361/709 |
| 9,769,962 | B2* | 9/2017 | Huang | H05K 7/20927 |
| 2003/0137813 | A1 | 7/2003 | Onizuka et al. | |
| 2006/0061937 | A1 | 3/2006 | Takemoto et al. | |
| 2008/0050645 | A1 | 2/2008 | Kai et al. | |
| 2012/0250252 | A1* | 10/2012 | Iguchi | H05K 7/20927 |
| | | | | 361/689 |
| 2017/0181333 | A1* | 6/2017 | Kosaka | H05K 7/20254 |
| 2017/0311433 | A1* | 10/2017 | Sumida | H05K 1/0203 |
| 2017/0353020 | A1* | 12/2017 | Yamashita | H05K 7/20445 |

FOREIGN PATENT DOCUMENTS

| | | |
|---|---|---|
| JP | 2008035671 A | 2/2008 |
| JP | 2014082844 A | 5/2014 |

\* cited by examiner

ELECTRICITY STORAGE UNIT

CROSS-REFERENCE TO RELATED APPLICATIONS

This application is the U.S. national stage of PCT/JP2015/085536 filed Dec. 18, 2015, which claims priority of Japanese Patent Application No. JP 2015-001363 filed Jan. 7, 2015.

TECHNICAL FIELD

The present specification discloses technology that includes a circuit portion and a power storage element.

BACKGROUND

Conventionally, an electrical connection box is known in which a circuit portion having electronic components mounted thereon is housed inside a case. JP 2014-82844A discloses an electrical connection box that includes a circuit portion having an electronic component mounted thereon, an electrically conductive heat dissipation member that dissipates heat from the circuit portion, and an electrically conductive case that, along with the heat dissipation member, houses the circuit portion. The case that covers the circuit portion is connected to a vehicle ground via a relay ground terminal, and electromagnetic noise generated by high-speed switching of the electronic component or the like is shielded by the case.

In the case where an electrical connection box and a power storage element are installed separately from each other in a vehicle or the like, electrical wires and connectors are needed in order to connect them, and therefore there are problems such as an increase in the number of components and an increase in weight, as well as power transmission loss caused by resistance in the electrical wires. In view of this, consolidating the circuit portion of the electrical connection box and the power storage element is preferable due to making it possible to suppress an increase in weight caused by electrical wires, connectors, and the like, as well as power transmission loss caused by resistance in the electrical wires.

JP 2005-94943A discloses a capacitor unit that includes a capacitor block, a control circuit portion constituted by a charging/discharging circuit for performing charging or discharging of the capacitor block, and a case that houses the capacitor block and the control circuit portion. This control circuit portion is incorporated in the case in the state of being covered by a shielding case that is divided into upper and lower portions.

However, similarly to the electrical connection box used in the case where the control circuit portion and the power storage element are arranged separately from each other, in JP 2005-94943A, the entirety of the control circuit portion needs to be covered by the shielding case (case), thus leading to the problem that simplification of the configuration is not easy.

The present invention was achieved in light of the above-described circumstances, and an object thereof is to provide an electricity storage unit that makes it possible to suppress the influence of noise from the circuit portion and to consolidate the circuit portion and the power storage element.

SUMMARY

An electricity storage unit of the present invention includes: a circuit portion on which an electronic component is mounted; a power storage element; and a holding member that holds the power storage element, wherein the holding member includes an electrically conductive shield wall portion between the circuit portion and the power storage element, and the shield wall portion shields noise generated by the circuit portion.

According to this configuration, in the electricity storage unit, the holding member holds the power storage element, and the shield wall portion of the holding member is provided between the circuit portion and the power storage element, and therefore noise generated by the circuit portion can be shielded by the shield wall portion. Accordingly, it is possible to suppress the influence of noise from the circuit portion and to consolidate the circuit portion and the power storage element. Also, even if only the circuit portion is not housed in an electrically conductive case, noise generated by the circuit portion can be shielded using the configuration of the holding member that holds the power storage element, thus making it possible to simplify the configuration of the electricity storage unit.

The following are preferred embodiments of the present invention.

The electricity storage unit further includes an electrically conductive heat dissipation member that dissipates heat from the circuit portion.

The heat dissipation member is arranged on a side of the circuit portion that is opposite to a power storage element side, and is electrically connected to the holding member.

According to these configurations, the holding member and the heat dissipation member are electrically connected to each other, and therefore the side of the circuit portion that is opposite to the shield wall portion can be shielded by the heat dissipation member.

The shield wall portion includes a positioning portion that positions the power storage element.

According to this configuration, the shield wall portion can be used for positioning of the power storage element.

The power storage element is placed on the shield wall portion.

According to this configuration, the shield wall portion for shielding the circuit portion can be used as the member for mounting the power storage element.

The electricity storage unit includes an electrically conductive attachment portion for attachment to an external ground, and the attachment portion is fixed by screw fastening.

According to this configuration, if the attachment portion is attached to an external ground, the shield wall portion can be electrically grounded.

A heat insulating layer is formed between the shield wall portion and the electronic component that is a heat source.

If the power storage element is arranged below the circuit portion, heat from the circuit portion is readily transmitted to the power storage element, and there is concern of degradation of the power storage element caused by heat from the heat source. In this case, it is conceivable to prevent heat from the heat source from being readily transmitted to the power storage element by forming a gap between the circuit portion and the power storage element below the circuit portion, but this has the problem that the size of the electricity storage unit increases by an amount corresponding to the gap. According to the above configuration, the heat insulating layer is formed between the heat source and the shield wall portion that is formed between the circuit portion and the power storage element, thus making it possible to suppress degradation of the power storage element caused by heat from the heat source so as to protect the power storage element, and also making it possible to reduce the size of the electricity storage unit by effectively utilizing the space between the shield wall portion and the heat source as the heat insulating layer.

The holding member includes a housing wall that houses the power storage element therein, and an opening portion that enables the power storage element to be inserted into the housing wall, and a cover that closes the opening portion is provided.

According to this configuration, portions that do not need to be shielded are covered by the cover, thus making it possible to protect the power storage element.

The holding member is arranged surrounding the circuit portion, and an electrically conductive peripheral wall that abuts against the heat dissipation member is provided.

According to this configuration, the periphery of the circuit portion can be shielded by the peripheral wall, and the weight of the power storage element can be supported by the peripheral wall due to the peripheral wall abutting against the heat dissipation member.

According to the present invention, it is possible to suppress the influence of noise from the circuit portion and to consolidate the circuit portion and the power storage element.

DETAILED DESCRIPTION OF THE PREFERRED EMBODIMENTS

Embodiment

An embodiment will be described below with reference to FIGS. 1 to 18.

An electricity storage unit 10 (FIG. 1) is arranged in a power supply path between a main power supply, which is constituted by a battery or the like of a vehicle such as an electric automobile or a hybrid automobile, and a load constituted by a drive motor or an in-vehicle electrical component such as a lamp, for example, and the electricity storage unit 10 can be used as a charging/discharging control apparatus and an auxiliary power supply during engine idling stop and engine restart, for example. In the following description, the vertical direction and the horizontal direction are based on FIG. 4 (the X direction being the rightward direction, and the Z direction being the upward direction), and the front-rear direction is based on the downward direction in FIG. 2 being the frontward direction and the upward direction (Y direction) being the rearward direction.

Electricity Storage Unit 10

Figure 8:
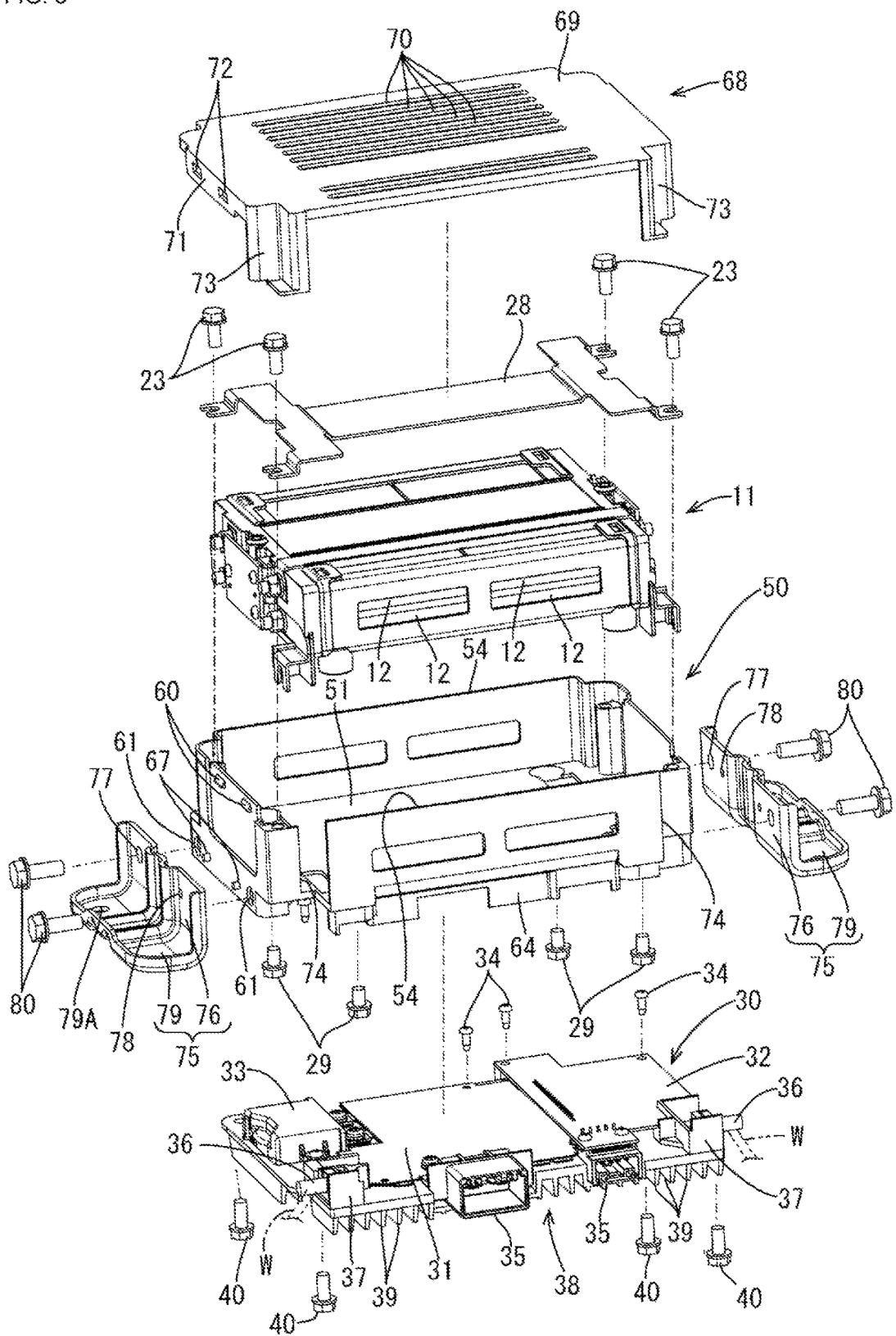
FIG. 8 is an exploded perspective view of the electricity storage unit.

As shown in FIG. 8, the electricity storage unit 10 includes a power storage module 11 that has multiple (four in the present embodiment) power storage elements 12, a holding member 50 that holds the power storage module 11, a cover 68 that covers an opening portion 54 of the holding member 50, a circuit portion 30 on which electronic components 33 are mounted, a heat dissipation member 38 that dissipates heat from the circuit portion 30, and attachment portions 75 for attaching the electricity storage unit 10 to a mounting portion of a vehicle or the like.

Power Storage Module 11

Figure 9:
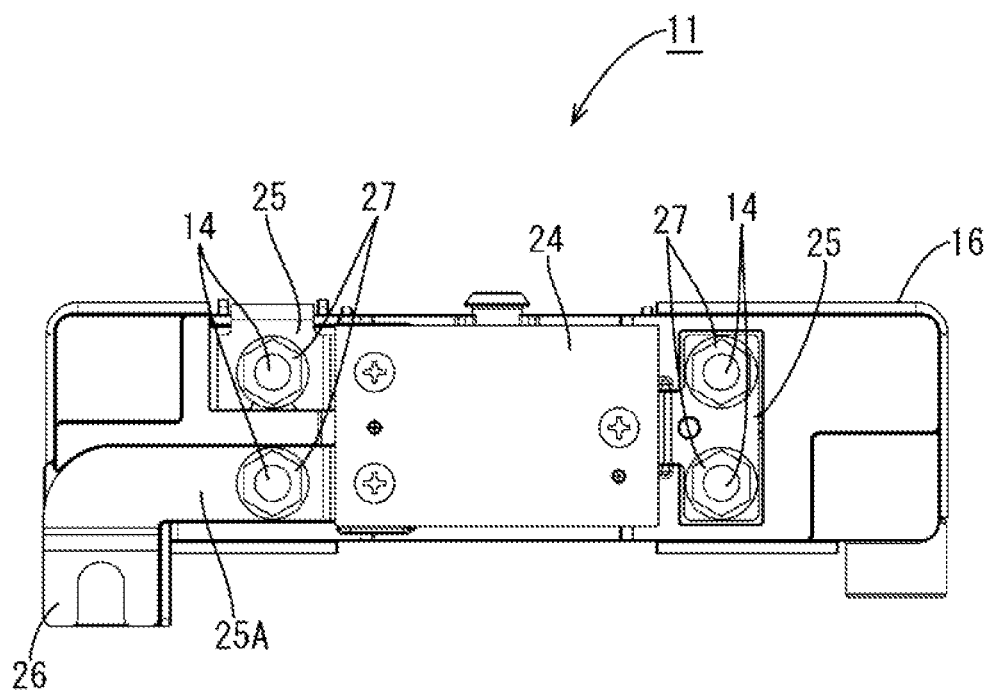
FIG. 9 is a right-side view of a power storage module.
Figure 10:
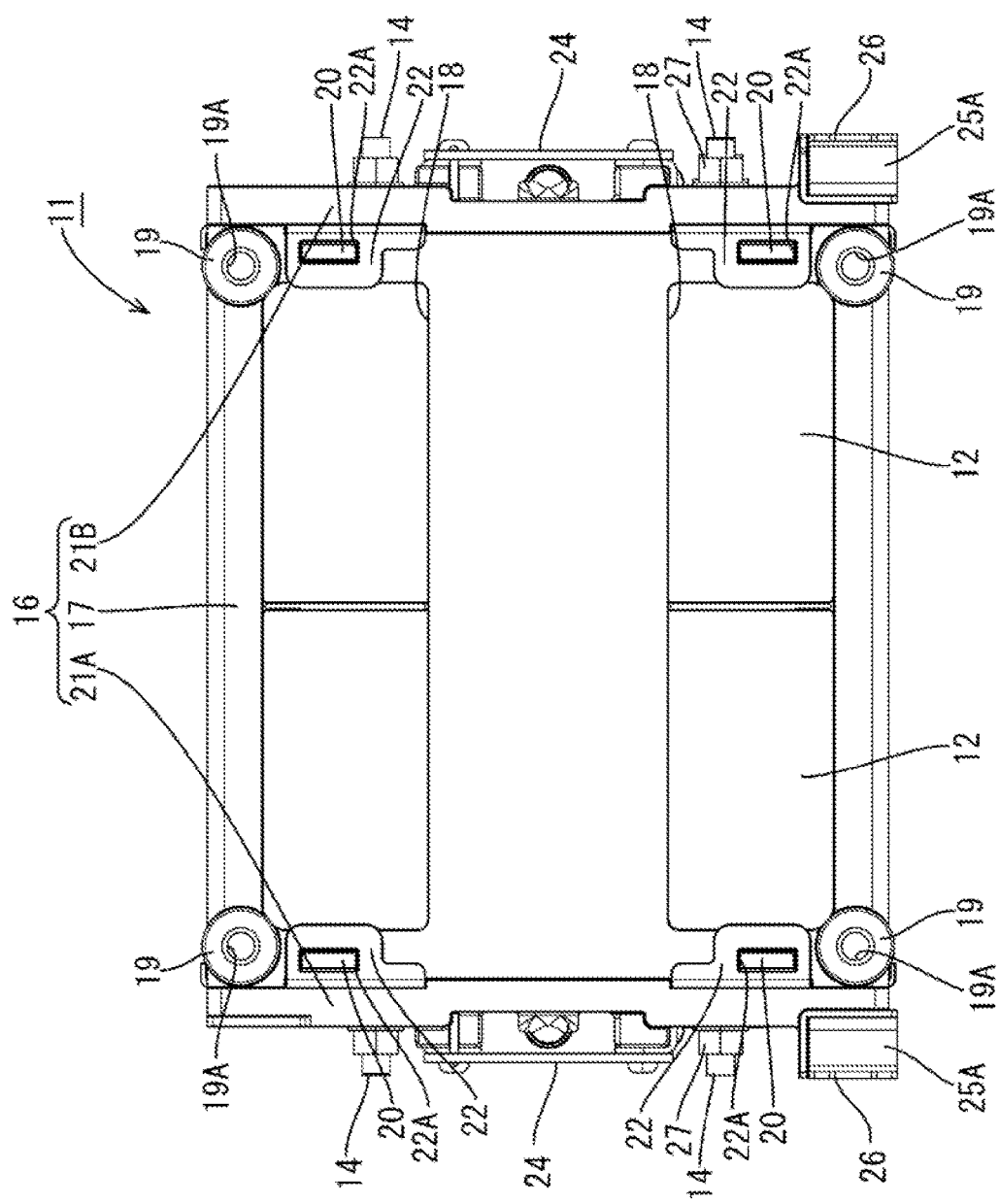
FIG. 10 is a bottom view of the power storage module.

As shown in FIGS. 9 and 10, the power storage module 11 includes multiple power storage elements 12 that are used as an auxiliary power supply having a smaller capacity than the main power supply, a power storage element case 16 that is made of a synthetic resin and houses the power storage elements 12, a pair of printed circuit boards 24, and connection members 25 that are made of a metal and connect electrode terminals 14 to each other.

The power storage elements 12 are arranged in left-and-right pairs in two rows vertically, and each have a pair of electrode terminals 14 that protrude perpendicularly from an end surface of a main body portion that has a flattened parallelepiped shape and houses a power storage element (not shown). The power storage elements 12 in each left-and-right pair are arranged such that the electrode terminals 14 face away from each other. Electrode terminals 14 having unlike poles are connected together by the connection members 25 such that the power storage elements 12 are connected in series overall.

The power storage element case 16 includes a frame portion 17 that forms a rectangular tube-shaped space therein, and a pair of lid portions 21A and 21B that close the left and right openings of the frame portion 17. Exposure holes 18 that expose the power storage elements 12 are formed in the frame portion 17. Circular column-shaped boss portions 19, which can be fitted into the holding member 50 so as to position the power storage module 11, protrude downward from positions at the four corners of the bottom surface of the frame portion 17. Threaded holes 19A, into which metal screws 29 can be screwed, are formed in the boss portions 19. Taper portions for guiding the insertion of the screws 29 are formed at the openings of the threaded holes 19A.

Locking pieces 22 that are capable of flexing deformation protrude toward the frame portion 17 from peripheral edge portions of the lid portions 21A and 21B. Rectangular locking holes 22A are formed in the locking pieces 22, and when the hole edges of these locking holes 22A are locked by locking protrusion portions 20 formed on the outer surface of the frame portion 17, removal of the lid portions 21A and 21B from the frame portion 17 is restricted.

The printed circuit board 24 is constituted by an insulated board on which a conduction path pattern is printed, and is electrically connected to the electrode terminals 14.

The connection members 25 are constituted by a metal plate member made of a copper alloy or the like, and are fastened to the electrode terminals 14 that pass through the lid portions 21A and 21B with use of nuts 27 as fastening members. Terminal connection portions 26 for connection to terminal portions 36 of the circuit portion 30 are provided on connection members 25A, which are the connection members 25 that are connected to the electrode terminals 14 located at the ends in the series connection. The terminal connection portions 26 are formed at leading end portions of the connection members 25A that are bent into a crank shape, and have leading portions that are U-shaped so as to fit around the circular column-shaped terminal portions 36.

Circuit Portion 30

The circuit portion 30 has the functionality of a DC-DC converter, an inverter, or the like, and as shown in FIG. 8, includes two rectangular circuit boards 31 and 32, multiple electronic components 33 mounted on the circuit boards 31 and 32, and connector portions 35 attached to the circuit boards 31 and 32.

The circuit board 31 is constituted by a printed circuit board, which is an insulated board on which a conductive path pattern is printed, and a bus bar that is obtained by stamping a metal plate member into the shape of the conductive path and that is placed on the printed circuit board, and the circuit board 31 is fixed on the flat upper surface of the heat dissipation member 38 using an insulating adhesive. The circuit board 32 is constituted by a printed circuit board that is an insulated board on which a conductive path pattern is printed, and the circuit board 32 is arranged at a higher position than the circuit board 31 and in a different region from the same, and is connected to the circuit board 31 via a relay terminal. The circuit boards 31 and 32 are screwed to the heat dissipation member 38 using screws 34. The electronic components 33 include a relay such as a FET (Field Effect Transistor) 33A (see FIG. 6), a capacitor (the relay, capacitor, and the like are not shown in FIG. 8), coils screwed to an edge portion of the circuit board 31, and the like.

The connector portions 35 include connector housings that are screwed to edge portions of the circuit boards 31 and 32, and L-shaped connector terminals that are connected to the conductive paths of the circuit boards 31 and 32. Terminal portions 36 for connection to external electrical wires W are formed in corner portions on the front side of the circuit boards 31 and 32. The terminal portions 36 are held in terminal holding portions 37 that are made of a synthetic resin, and the terminal holding portions 37 are fixed to edge portions of the circuit boards 31 and 32.

Heat Dissipation Member 38

Figure 1:
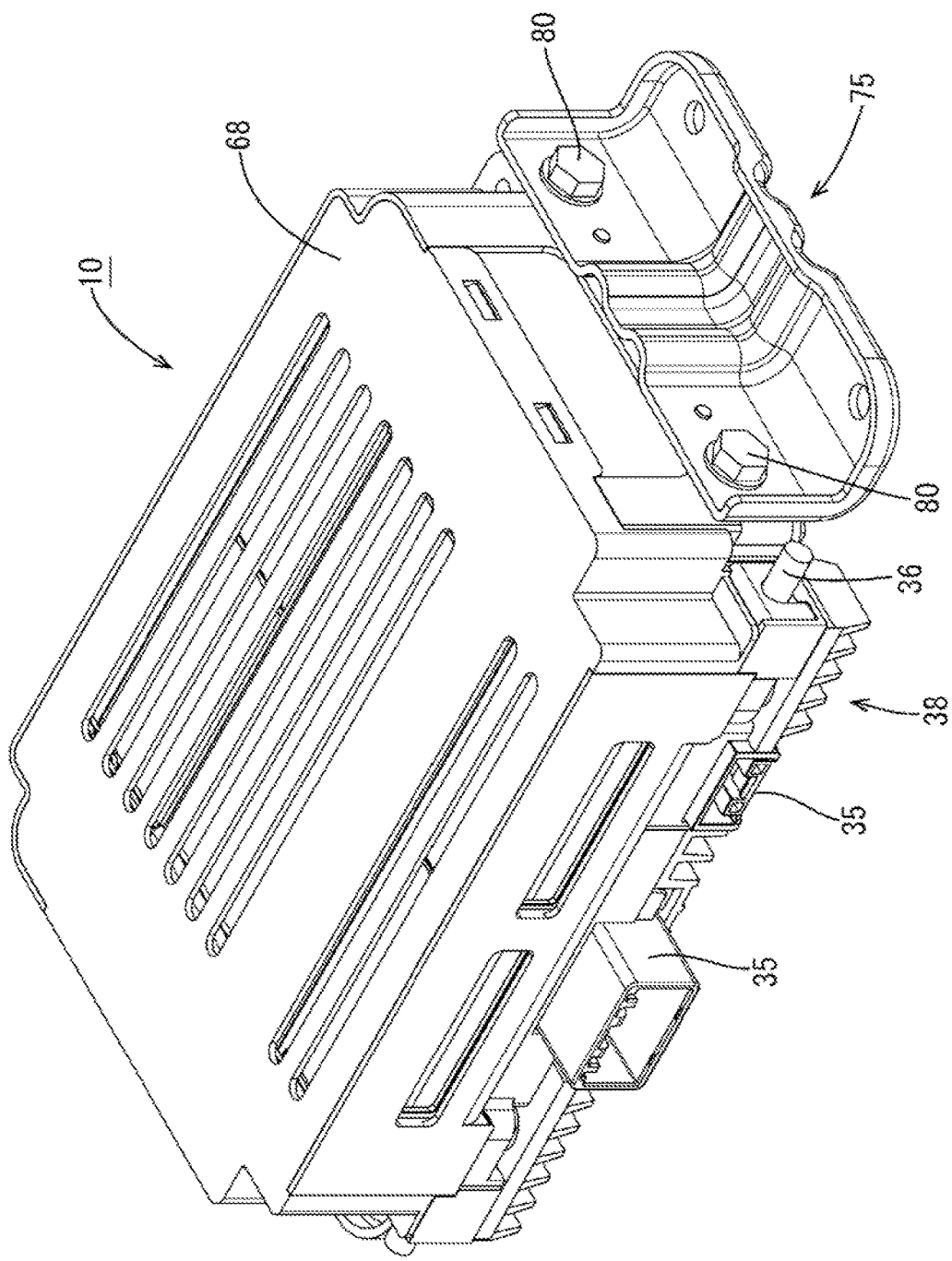
FIG. 1 is a perspective view of an electricity storage unit of an embodiment.
Figure 2:
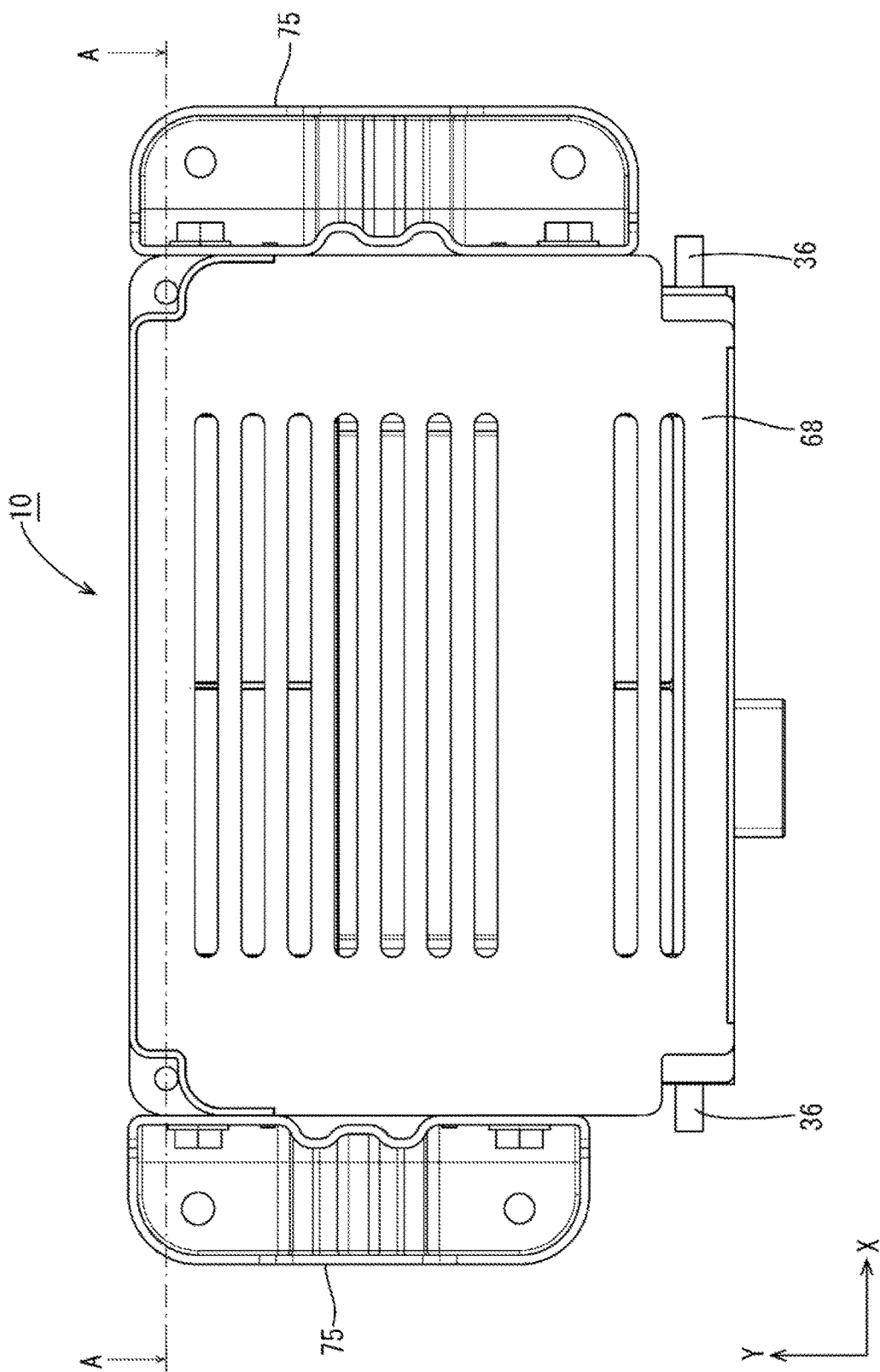
FIG. 2 is a plan view of the electricity storage unit.
Figure 3:
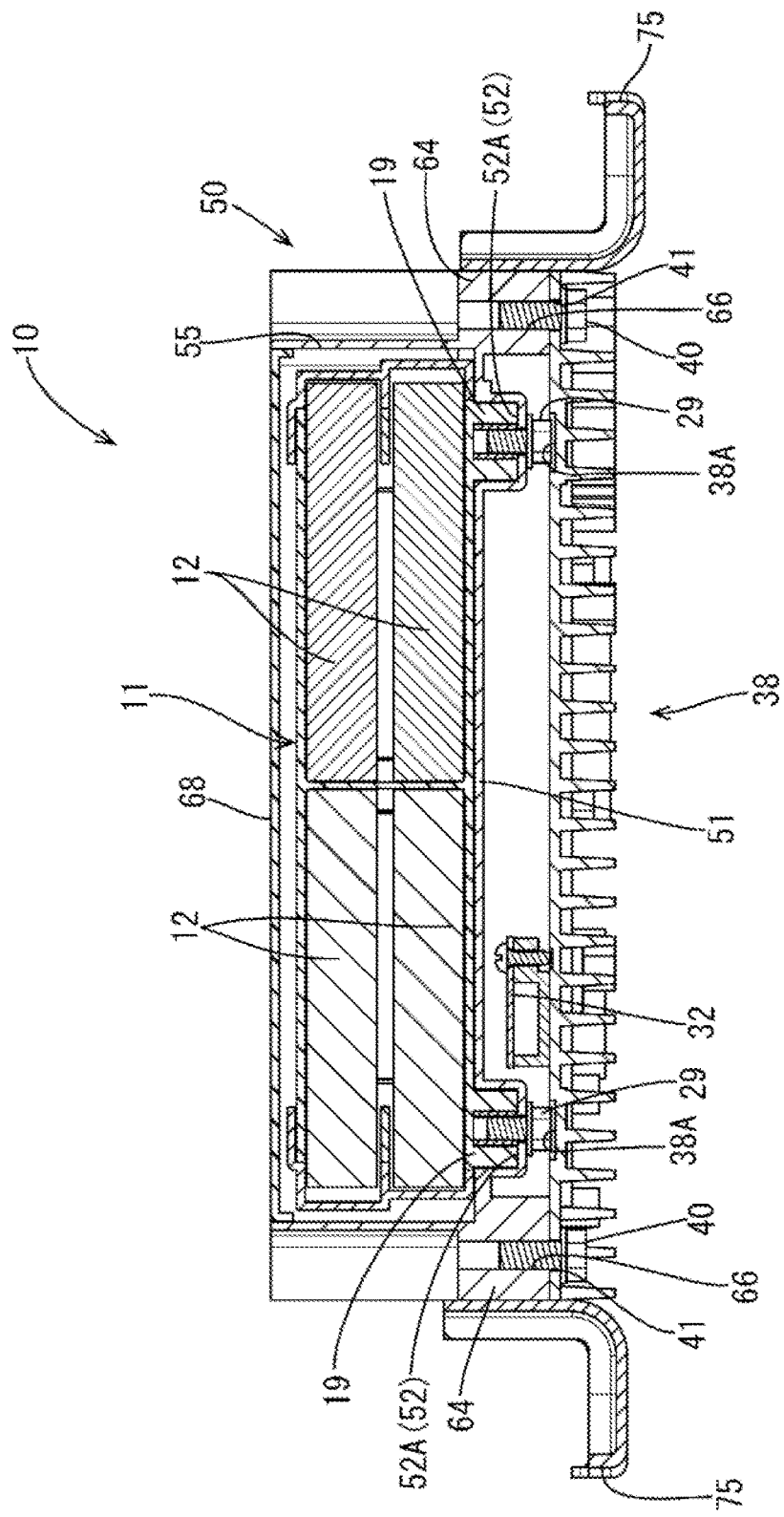
FIG. 3 is a cross-sectional view taken along A-A in FIG. 2.
Figure 11:
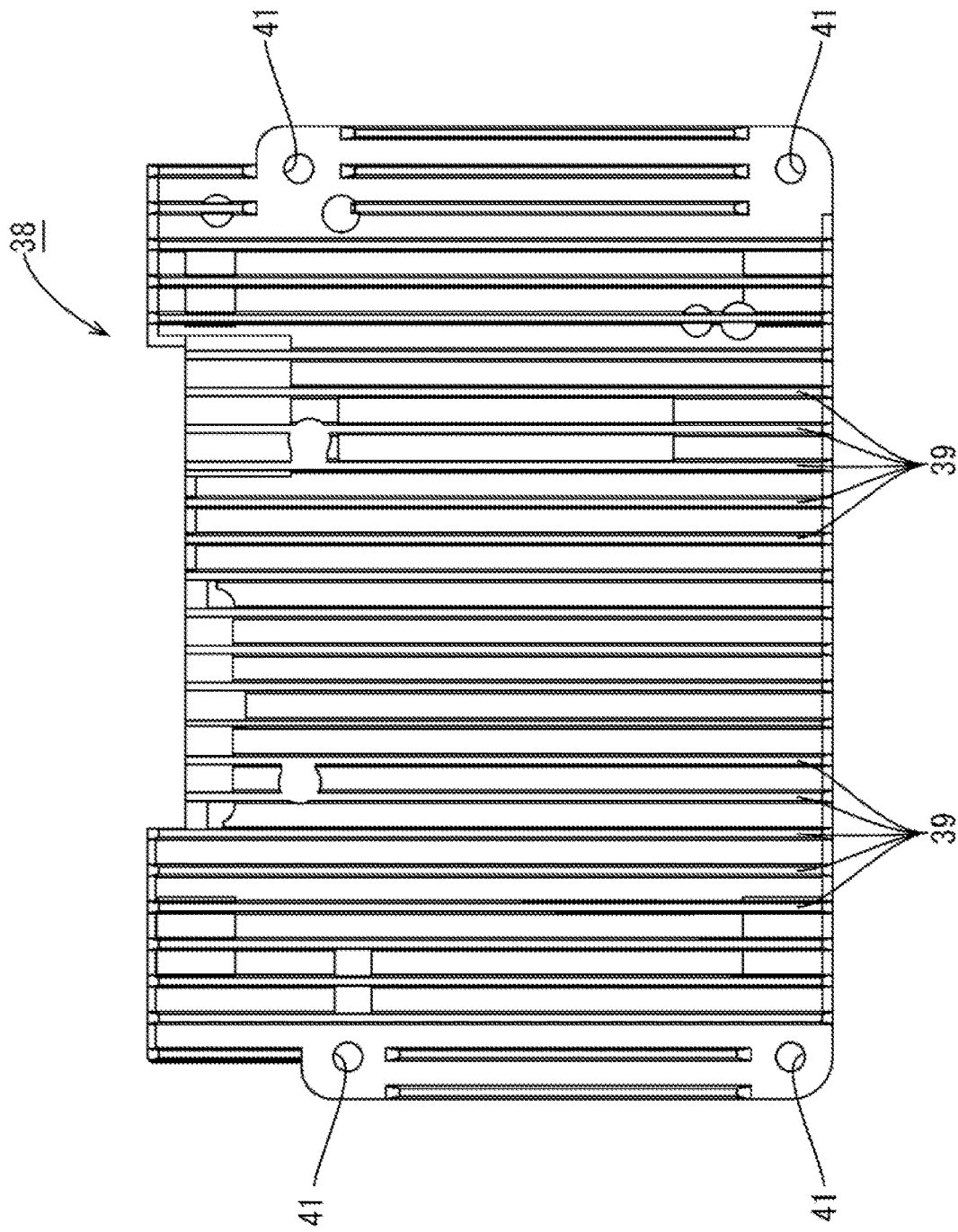
FIG. 11 is a bottom view of a heat dissipation member.

The heat dissipation member 38 is made of a metal material having high thermal conductivity such as an aluminum alloy or a copper alloy, is flat on the upper surface, and has many heat dissipating fins 39 arranged side-by-side on the lower surface side. Heat from the FET 33A is dissipated from the heat dissipation member 38 to the outside via the circuit portion 30. As shown in FIGS. 3 and 11, threaded holes 41, which are for screw-fastening to the holding member 50 using metal screws 40, are formed at four locations in the peripheral edge portion of the heat dissipation member 38.

Holding Member 50

Figure 12:
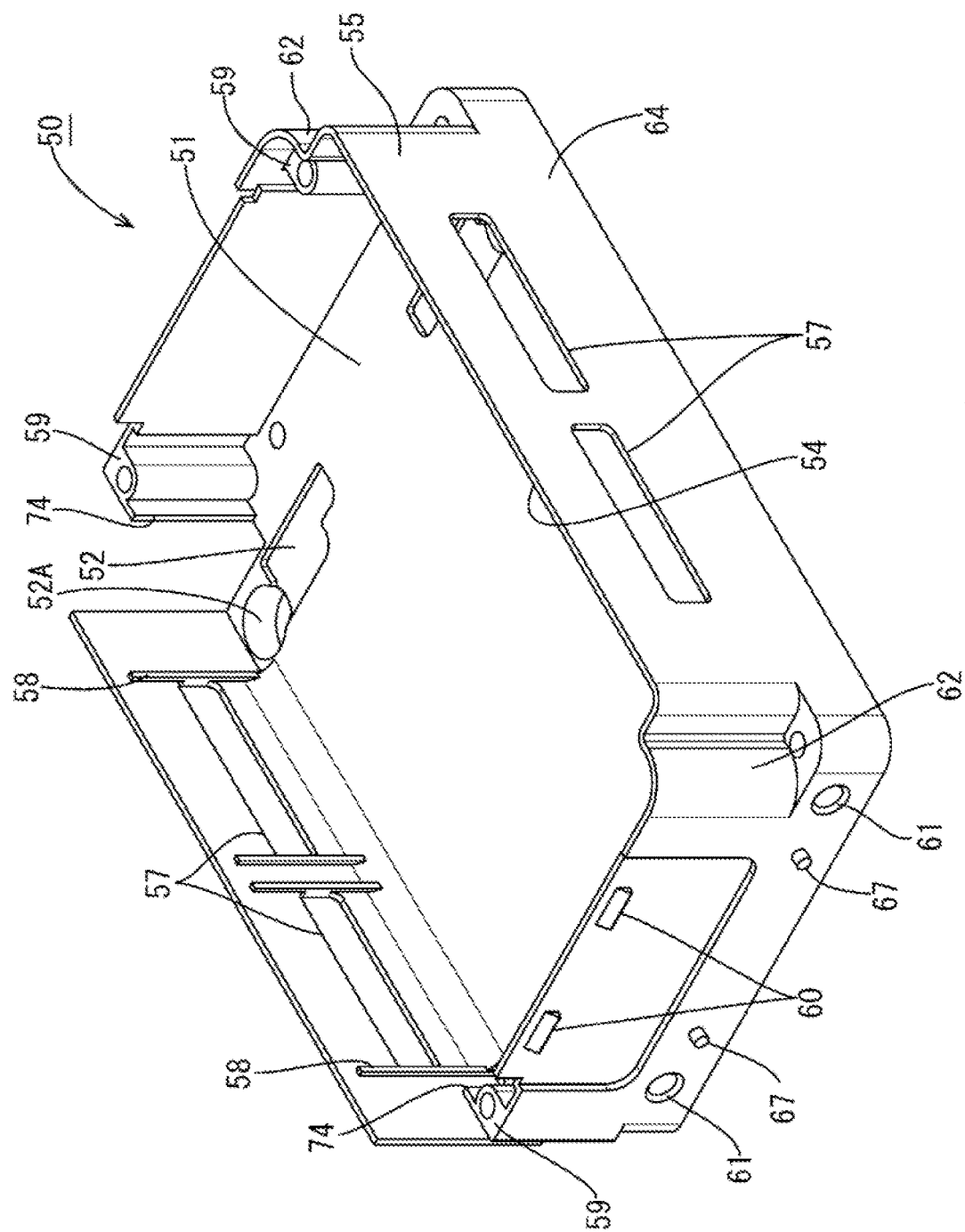
FIG. 12 is a perspective view of a holding member.
Figure 13:
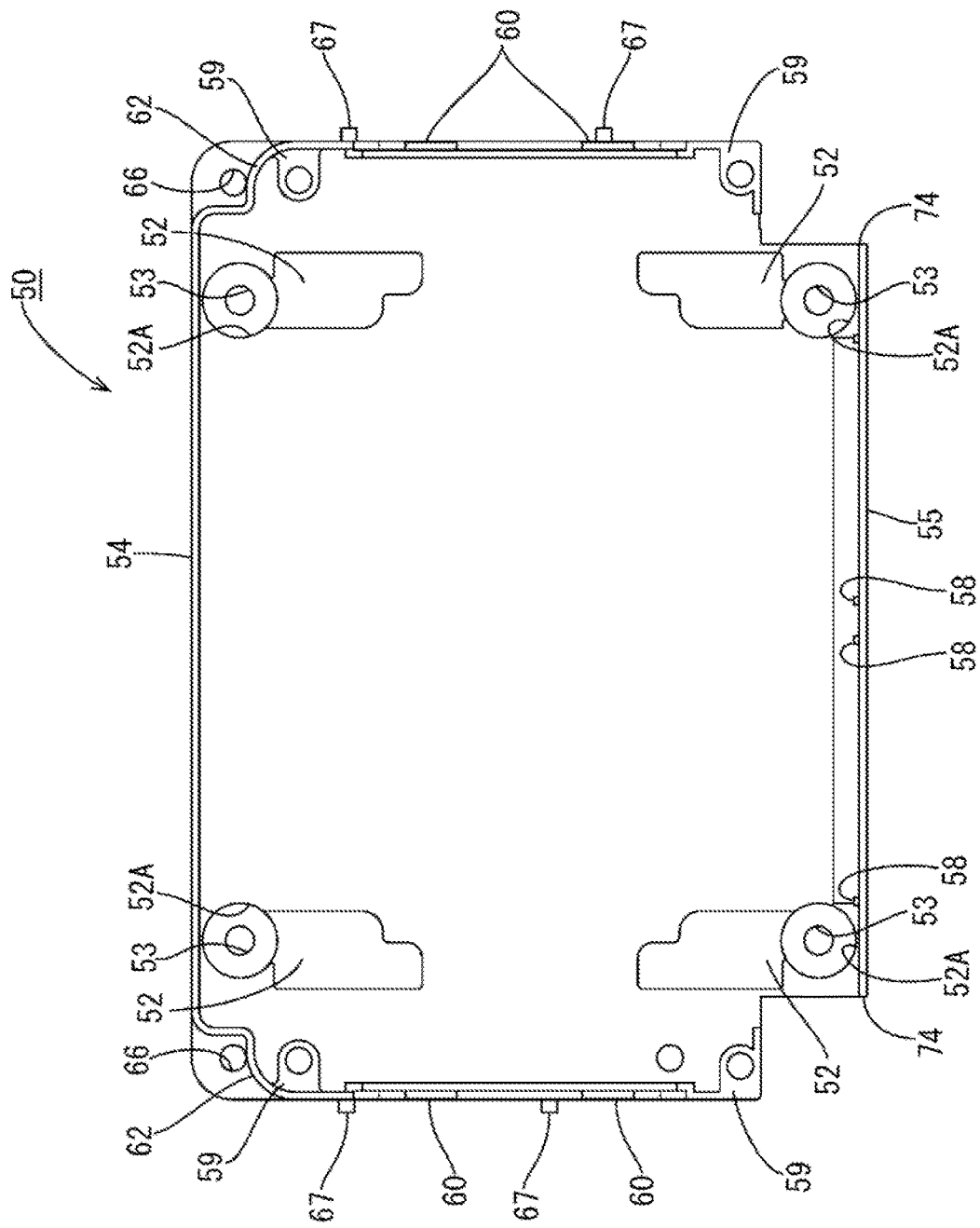
FIG. 13 is a plan view of the holding member.

The holding member 50 is made of a metal material such as aluminum or an aluminum alloy, is formed by aluminum die casting for example, and as shown in FIGS. 12 and 13, includes a rectangular plate-shaped shield wall portion 51 that is arranged opposing the circuit portion 30, a rectangular tube-shaped housing wall 55 that protrudes upward from the peripheral edge portion of the shield wall portion 51, and a rectangular tube-shaped peripheral wall 64 that protrudes downward from the peripheral edge portion of the shield wall portion 51 with a smaller height than the housing wall 55.

Figure 6:
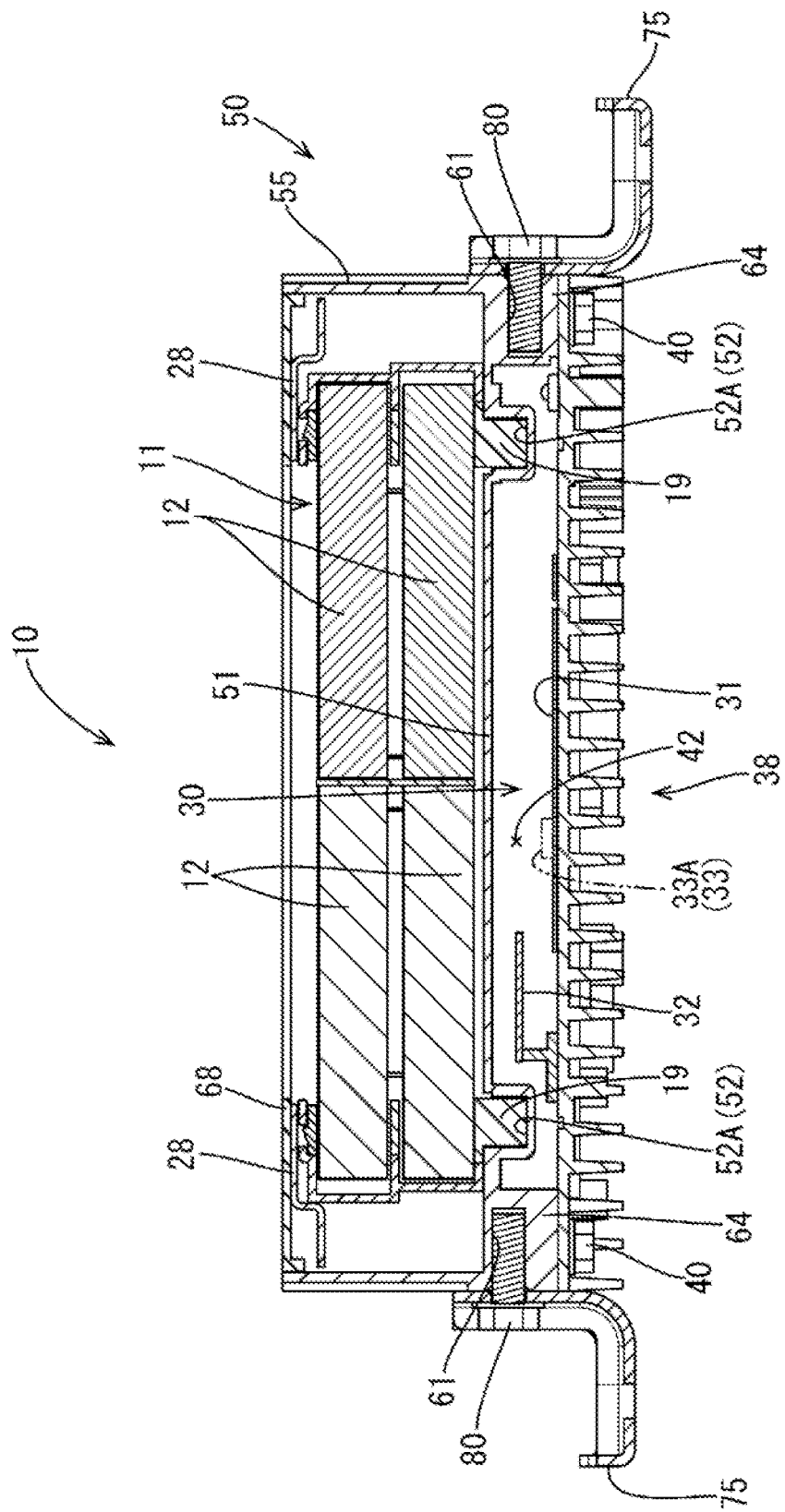
FIG. 6 is a cross-sectional view taken along B-B in FIG. 5.
Figure 7:
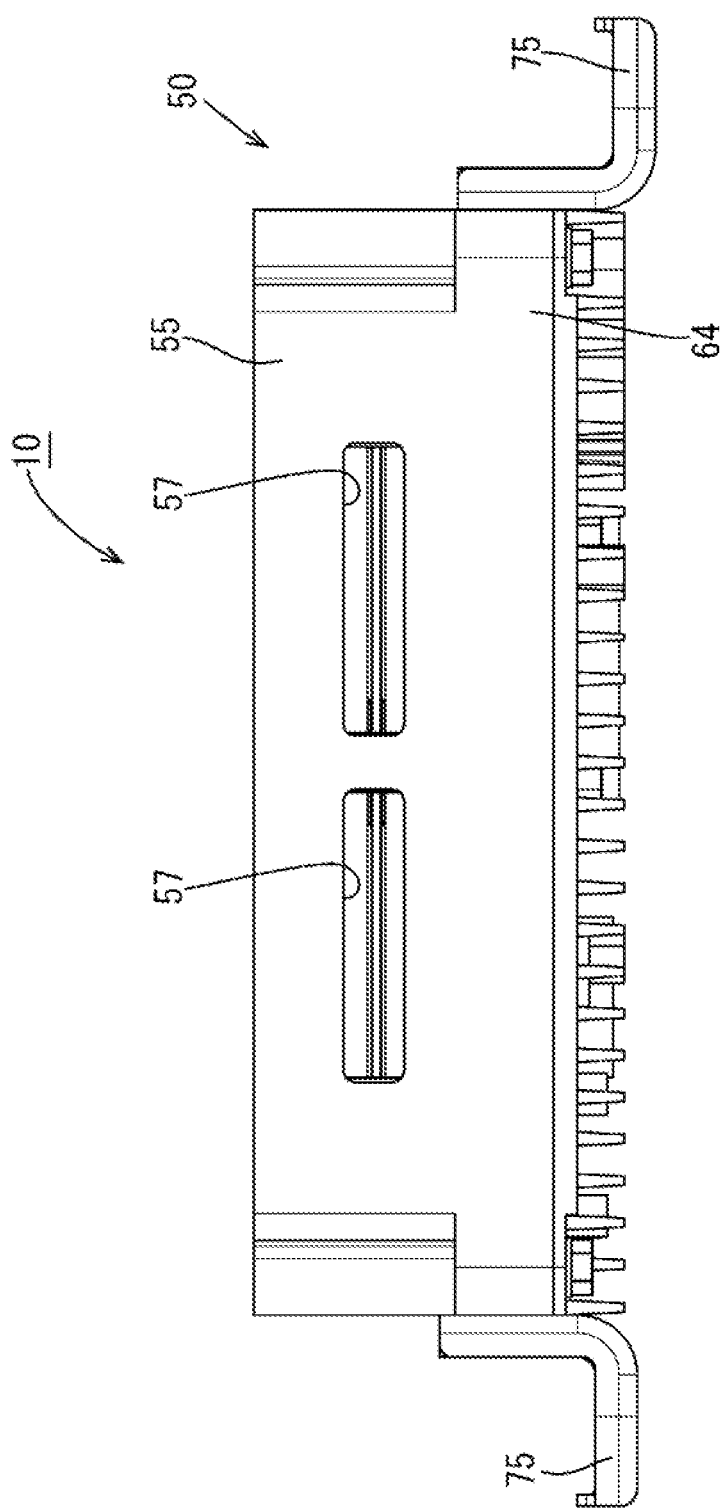
FIG. 7 is a back view of the electricity storage unit.

The shield wall portion 51 is shaped as a rectangle that is large enough to cover the entirety of the circuit portion 30, and is arranged opposing the circuit portion 30 with a gap therebetween (see FIG. 6). Accordingly, a heat insulating layer 42 (air layer) is formed between the shield wall portion 51 and the FET 33A that is a heat source.

The upper surface of the shield wall portion 51 is provided with positioning portions 52 that are formed as recessed portions having a shape corresponding to the shapes of the boss portions 19 and the locking pieces 22, and these positioning portions 52 are for positioning the power storage module 11 when protrusion portions constituted by the boss portions 19 and the locking pieces 22 of the power storage module 11 are fitted therein. The positioning portions 52 include positioning portions 52A into which the boss portions 19 are fitted, and the positioning portions 52A are provided with circular through-holes 53 into which the shaft portions of screws 29 are inserted. As shown in FIG. 3, when screws 29 are screwed into the boss portions 19 fitted into the positioning portions 52A, the bottom surfaces of the head portions of the screws 29 are located inside clearance recession portions 38A in the upper surface of the heat dissipation member 38.

Figure 14:
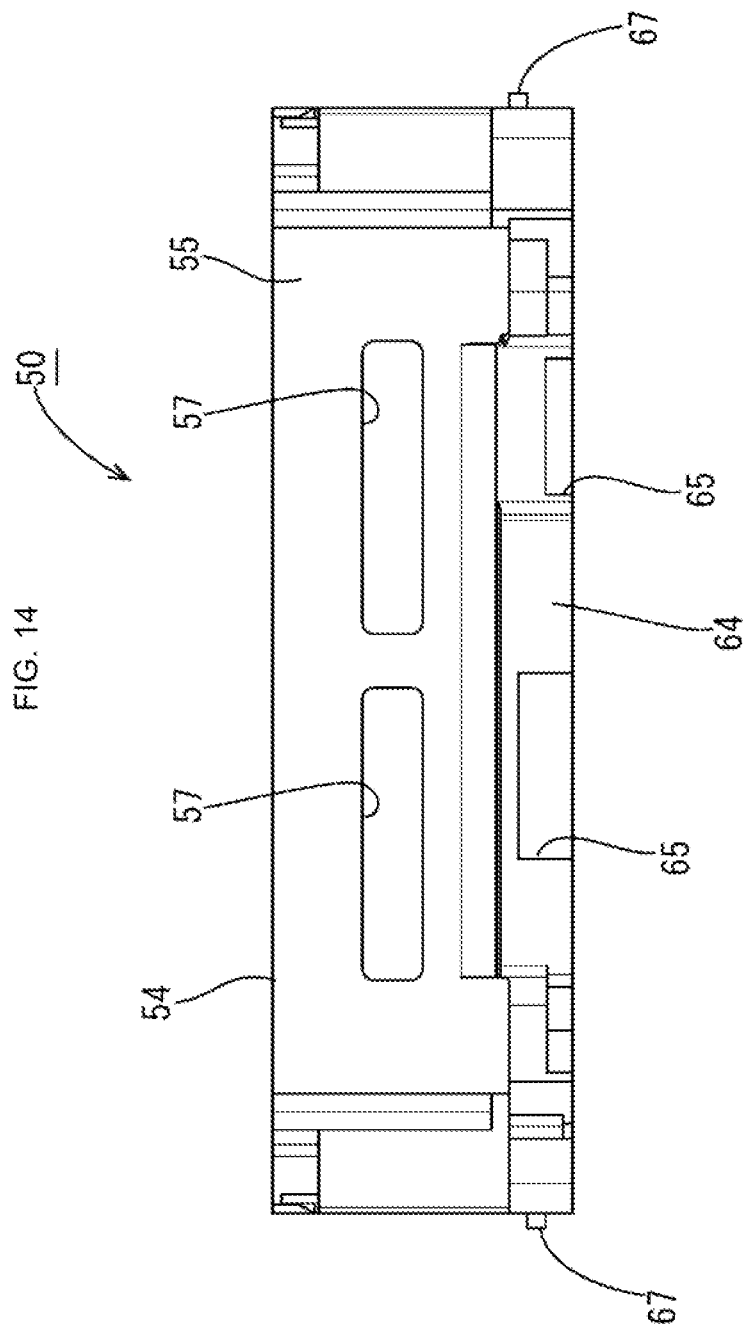
FIG. 14 is a front view of the holding member.
Figure 15:
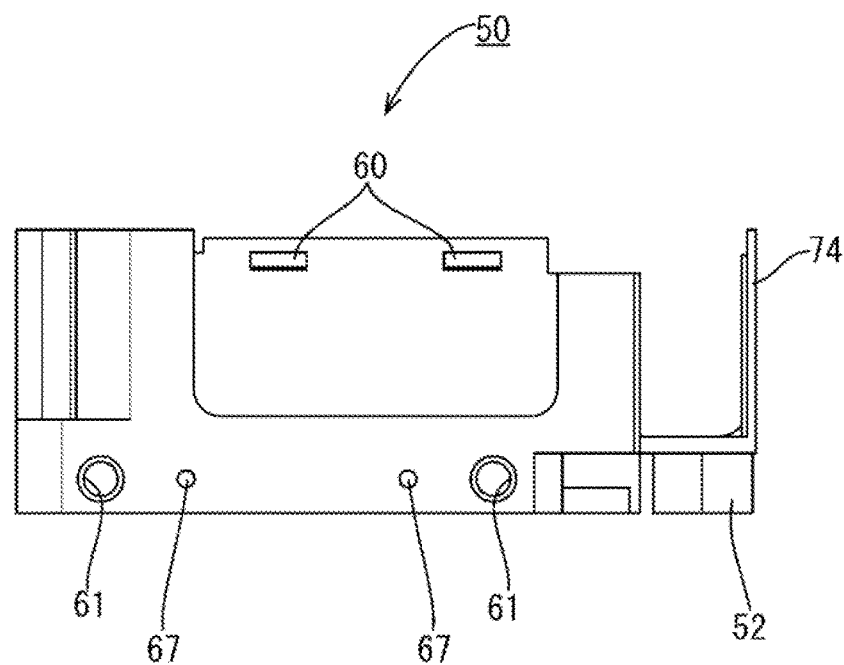
FIG. 15 is a left-side view of the holding member.
Figure 16:
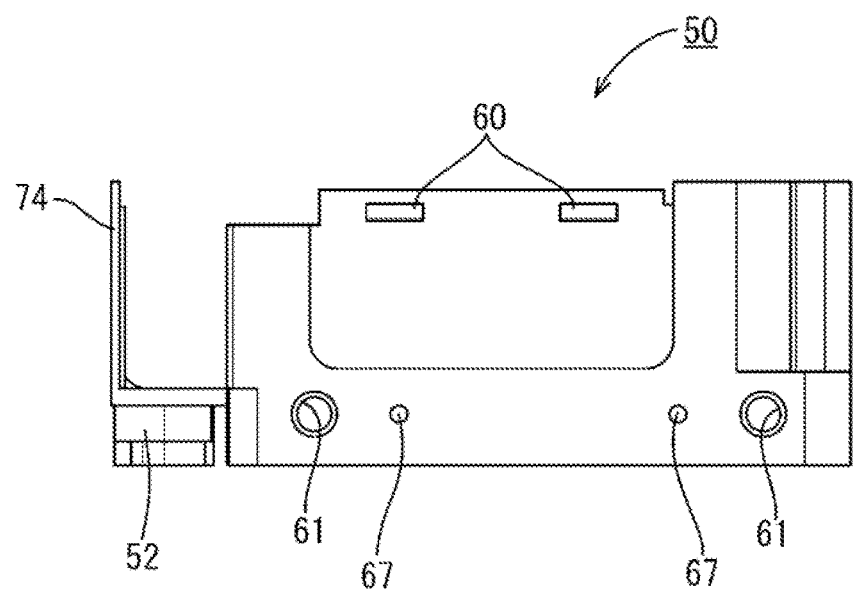
FIG. 16 is a right-side view of the holding member.
Figure 17:
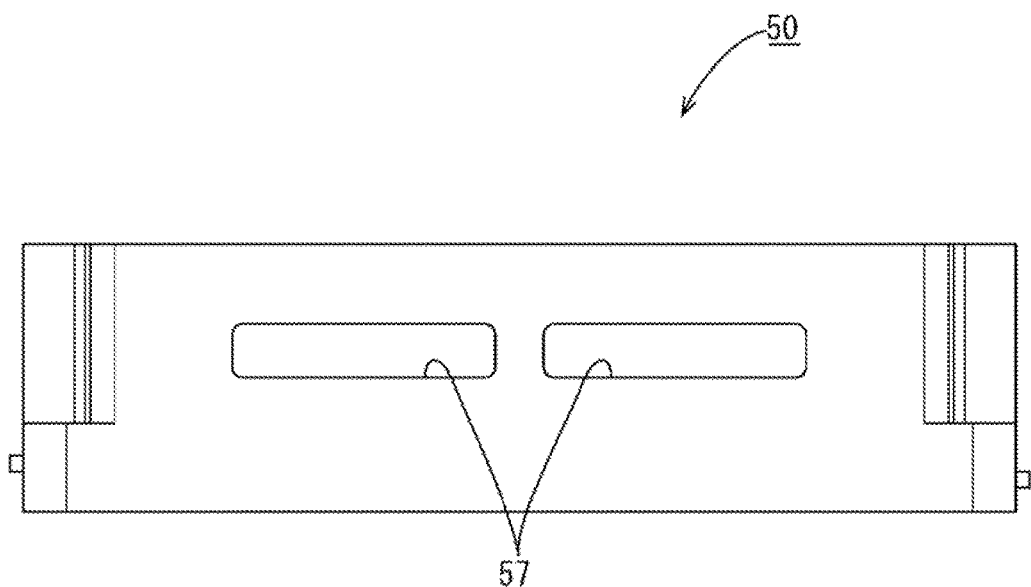
FIG. 17 is a back view of the holding member.
Figure 18:
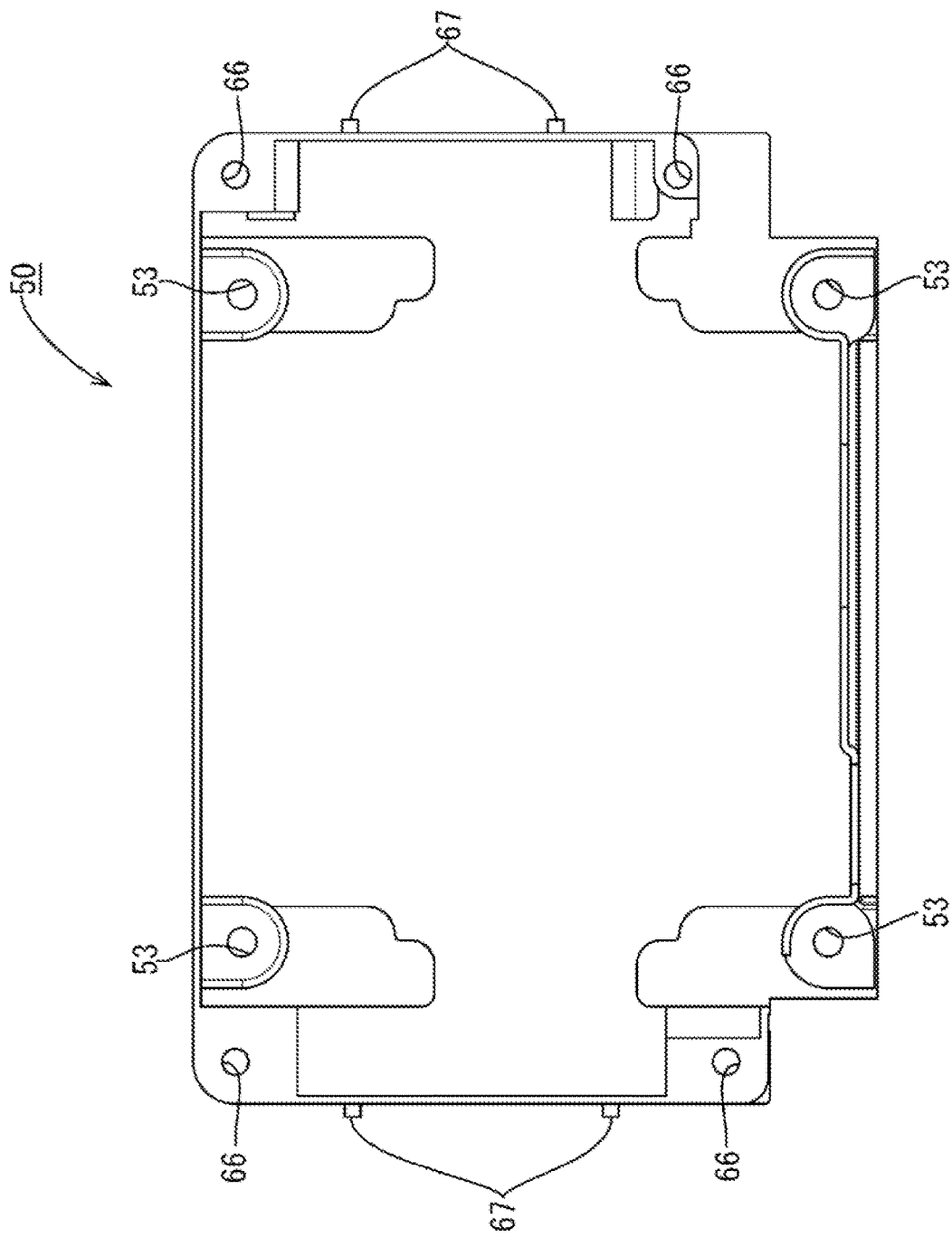
FIG. 18 is a bottom view of the holding member.

The housing wall 55 is shaped as a rectangular tube having a constant height that corresponds to the height of the power storage module 11 so as to surround the power storage module 11, and as shown in FIGS. 12 to 14, rectangular communication holes 57 that are continuous with the exposure holes 18 of the power storage module 11 are formed in the front wall and the rear wall of the housing wall 55. Ribs 58 that extend in the vertical direction protrude from the front wall of the housing wall 55 on respective sides of the communication holes 57. The upper end portion of the housing wall 55 is an opening portion 54 that is large enough to enable insertion of the power storage module 11 into the housing wall 55.

Four retaining portions 59, which are for screw-fastening a metallic presser plate 28 (see FIG. 8) using screws 23, are formed at positions in inner corner portions of the housing wall 55. The presser plate 28 suppresses bulging of the power storage elements 12, and the power storage module 11 is sandwiched between the shield wall portion 51 and the presser plate 28, thus positioning the power storage module 11 in the vertical direction. Locking portions 60 for locking the cover 68 protrude from the left and right outer surfaces of the housing wall 55. The housing wall 55 is discontinuous in the two end portions on the front side of the housing wall 55, thus forming terminal lead-out portions 74 that enable the terminal portions 36 to be led out. Depression portions 62 are formed as inward depressions in the corner portions in the two end portions on the rear side of the housing wall 55.

The peripheral wall 64 is arranged so as to surround the entire periphery of the circuit portion 30, and is formed with a height capable of closing off the space between it and the upper surface of the heat dissipation member 38 with no gaps. The left and right outer surfaces of the peripheral wall 64 are each provided with multiple threaded holes 61 for screw-fastening, with use of metal screws 80, an attachment portion 75 that is to be attached to a ground potential mounting portion of the vehicle, and positioning protrusion portions 67 for positioning the attachment portion 75. As shown in FIG. 3, retaining portions 66, which are constituted by threaded holes for screw-fastening the heat dissipation member 38 with screws 40, are formed in the bottom surface of the peripheral wall 64. The heat dissipation member 38 and the peripheral wall 64 are electrically connected by the screw-fastening of the retaining portions 66. As shown in FIG. 14, the front surface of the peripheral wall 64 is provided with cutout portions 65 that correspond to the positions of the connector portions 35 and enable the outer peripheries of the upper halves of the connector portions 35 to be fitted therein with substantially no gaps.

Cover 68

The cover 68 is made of an insulating synthetic resin, and as shown in FIG. 8, includes a plate-shaped portion 69 that is shaped as a rectangular plate, locked portions 71 that are locked to the holding member 50, and fitting portions 73 that are fitted into the terminal lead-out portions 74. Slits 70 arranged side-by-side in the front-rear direction are formed in the plate-shaped portion 69.

The locked portions 71 protrude downward from two side edges of the plate-shaped portion 69, and are each provided with multiple rectangular locking holes 72, and the locking portions 60 of the holding member 50 lock to the hole edges of the locking holes 72. The fitting portions 73 are formed as recessions in the corner portions, and extend downward with an L shape.

The attachment portions 75 are each constituted by L-shaped metal and include a holding-member-side fixing portion 76 that is fixed to the outer surface of the holding member 50, and an external fixing portion 79 that extends in a plate shape in a direction orthogonal to the holding member side fixing portion 76 and is to be fixed to an external portion. The holding-member-side fixing portion 76 is provided with through-holes 77 through which the shaft portions of screws 80 pass, and positioning holes 78 into which the positioning protrusion portions 67 on the outer surface of the peripheral wall 64 are fitted. The holding-member-side fixing portion 76 is electrically connected to the peripheral wall 64 by being screw-fixed to the outer surface of the peripheral wall 64 using screws 80. The external fixing portion 79 is provided with insertion holes 79A into which vehicle stud bolts or the like are inserted.

The following describes actions and effects of the present embodiment.

According to this embodiment, in the electricity storage unit 10, the holding member 50 holds the power storage elements 12, and the shield wall portion 51 of the holding member 50 is provided between the circuit portion 30 and the power storage elements 12, and therefore noise generated by the circuit portion 30 and noise from the outside can be shielded by the shield wall portion 51. Accordingly, it is possible to suppress the influence of noise from the circuit portion 30 and consolidate the circuit portion 30 and the power storage element 12. Also, noise generated by the circuit portion 30 can be shielded even if the entirety of the circuit portion 30 is not housed in an electrically conductive case, thus making it possible to simplify the configuration of the electricity storage unit 10.

Also, the electricity storage unit includes the electrically conductive heat dissipation member 38 that dissipates heat from the circuit portion 30, the heat dissipation member 38 is arranged on the side of the circuit portion 30 that is opposite to the power storage element 12 side, the holding member 50 has electrical conductivity, and the heat dissipation member 38 and the holding member 50 are electrically connected by being screwed together with screws 40.

According to this configuration, the electrically conductive holding member 50 and the electrically conductive heat dissipation member 38 are electrically connected, thus making it possible for the surface of the circuit portion 30 on the side opposite to the shield wall portion 51 to be shielded by the heat dissipation member 38.

Furthermore, the power storage module 11 (power storage elements 12) are placed on the shield wall portion 51.

According to this configuration, the shield wall portion 51 for shielding the circuit portion 30 can be used as the member for mounting the power storage module 11.

Also, the shield wall portion 51 includes the positioning portions 52 that position the power storage module 11 (power storage elements 12).

According to this configuration, the shield wall portion 51 can be used for positioning of the power storage module 11.

Furthermore, the electricity storage unit includes the electrically conductive attachment portions 75 for attachment to an external ground, and the attachment portions 75 are screw-fixed using screws 80.

According to this configuration, if the attachment portions 75 are attached to an external ground, the shield wall portion 51 can be electrically grounded.

Also, the heat insulating layer 42 is formed between the shield wall portion 51 and the FET 33A (electronic component) that is a heat source.

In the case where the power storage elements 12 are arranged below the circuit portion 30, heat from the circuit portion 30 is readily transmitted to the power storage elements 12. Instead of battery cells, capacitors can be used as the power storage elements 12, but capacitors have the problem that degradation is promoted by heat. For this reason, if the capacitors (power storage elements) are arranged below the circuit portion 30, heat from the circuit portion 30 is readily transmitted to the capacitors, thus causing the problem that degradation of the capacitor is promoted. In this case, it is conceivable to prevent heat from the FET 33A from being readily transmitted to the capacitors by forming a gap between the circuit portion 30 and the capacitors below the circuit portion 30, but this has the problem that the size of the electricity storage unit increases by an amount corresponding to the gap. In contrast to this, according to the present embodiment, the heat insulating layer 42 is formed between the FET 33A and the shield wall portion 51 that is formed between the circuit portion 30 and the power storage elements 12. For this reason, heat is transmitted from the FET 33A to the power storage elements 12 via the heat insulating layer 42, the shield wall portion 51, and the power storage element case 16, and therefore heat from the FET 33A is not readily transmitted to the power storage element 12. Accordingly, it is possible to suppress degradation of the power storage elements 12 caused by heat from the FET 33A, thus protecting the power storage elements 12, and it is also possible to reduce the size of the electricity storage unit 10 by effectively utilizing the space between the shield wall portion 51 and the FET 33A as the heat insulating layer 42.

Furthermore, the holding member 50 includes the housing wall 55 that surrounds the power storage module 11 (power storage elements 12), and the opening portion 54 that enables the power storage module 11 to be inserted into the housing wall 55, and the resin cover 68 that closes the opening portion 54 is provided.

According to this configuration, portions that do not need to be shielded are covered by the resin cover 68, thus making it possible to reduce manufacturing cost while also protecting the power storage elements.

Also, the holding member 50 includes the electrically conductive peripheral wall 64 that is arranged surrounding the circuit portion 30 and abuts against the heat dissipation member 38.

According to this configuration, the periphery of the circuit portion 30 can be shielded by the peripheral wall 64, and the weight of the power storage elements 12 can be supported by the peripheral wall 64 due to the peripheral wall 64 abutting against the heat dissipation member 38.

Other Embodiments

The present invention is not limited to the embodiment described using the above descriptions and drawings, and embodiments such as the following examples are also encompassed in the technical scope of the present invention.

(1) The shield wall portion 51 is made of a metal, but is not limited to being made of a metal, and need only have electrical conductivity. For example, the shield wall portion 51 may be formed from an electrically conductive resin, or an insulating plate member may be plated with a metal in order to shield noise from the circuit portion 30.

(2) The circuit portion 30 includes the two circuit boards 31 and 32, but the circuit boards 31 and 32 may be integrated into one circuit board.

(3) Although the entirety of the holding member 50 is made of a metal in the above embodiment, it is not required that the entirety is made of a metal, and it is sufficient that at least the shield wall portion 51 has electrical conductivity.

(4) The cover 68 is made of an insulating synthetic resin, but may be electrically conductive (made of a metal).

(5) The power storage elements 12 are battery cells, but there is no limitation to this, and they may be capacitors.

(6) The holding member 50 is not required to include the housing wall 55 and the peripheral wall 64.

Figure 4:
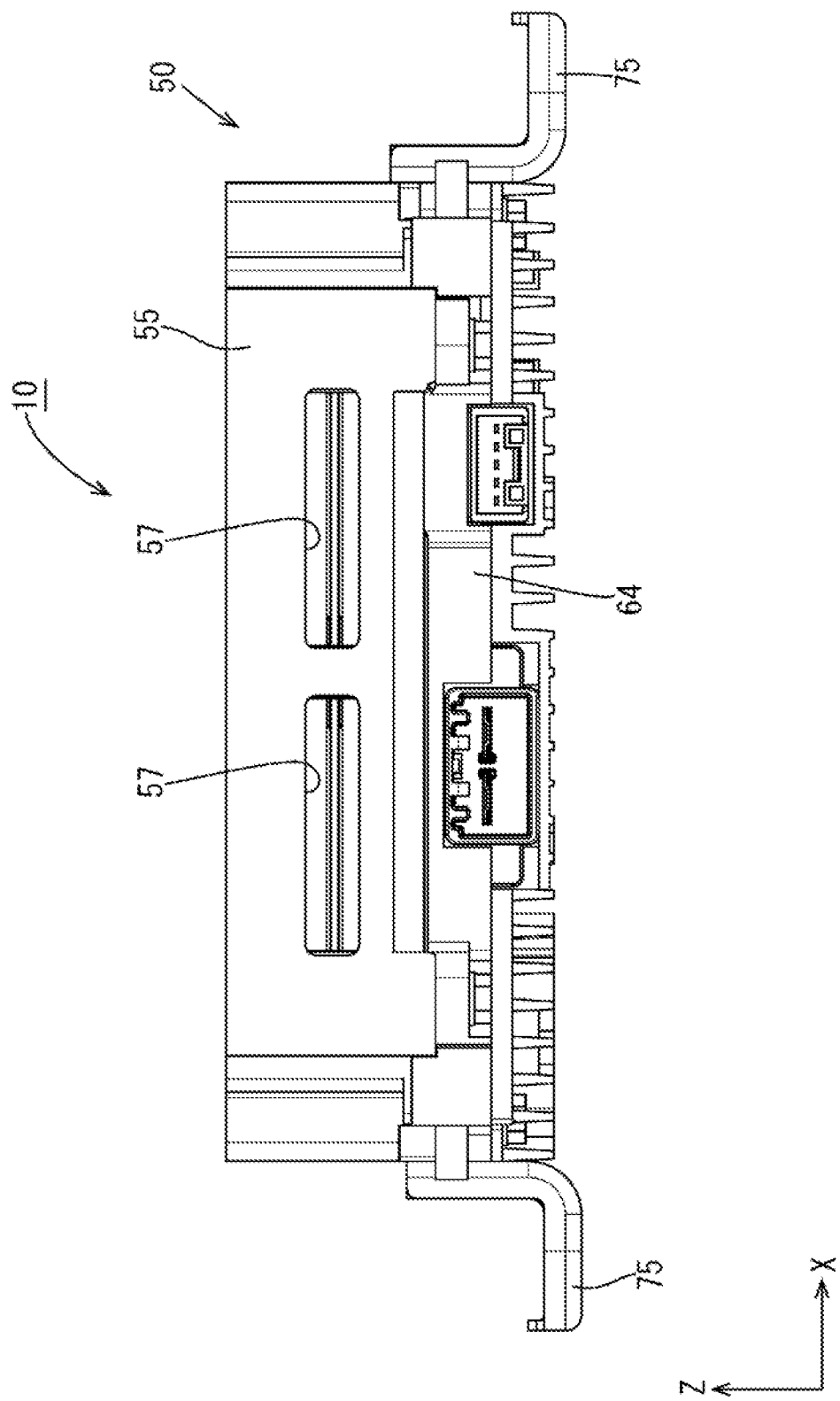
FIG. 4 is a front view of the electricity storage unit.
Figure 5:
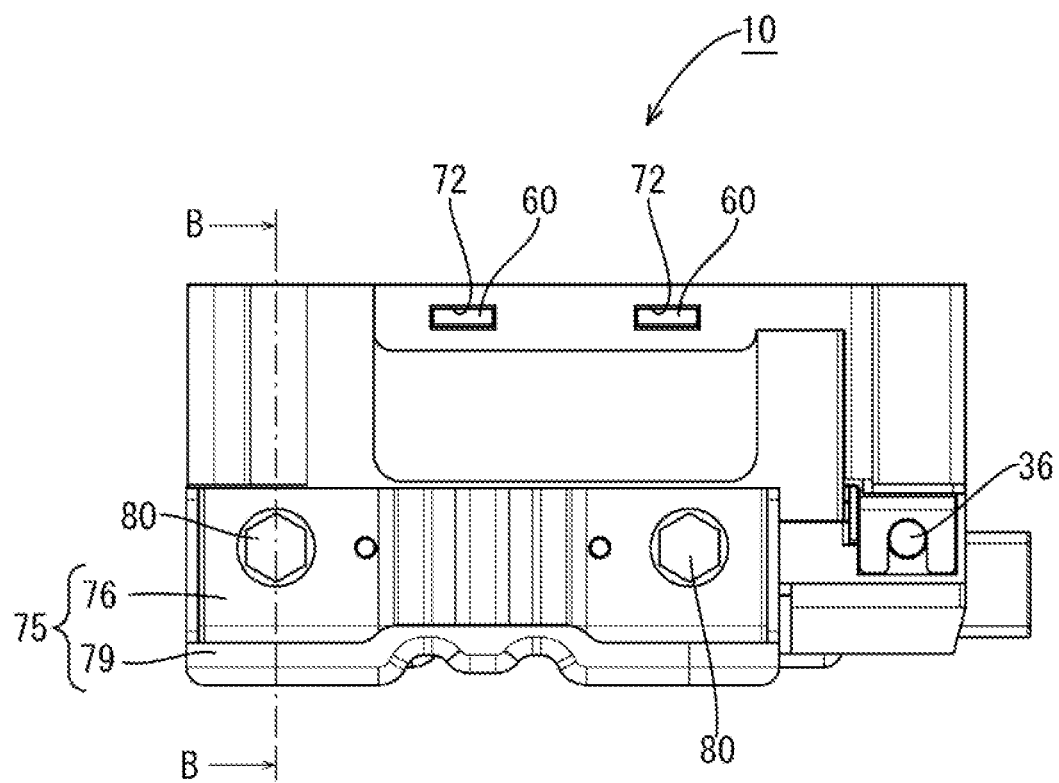
FIG. 5 is a left-side view of the electricity storage unit.

(7) The orientation in which the electricity storage unit 10 is installed in the vehicle or the like is not limited to the orientation in the above embodiment, and it can be arranged in various orientations. For example, it may be arranged such that the horizontal direction in FIG. 4 is the vertical direction (the X direction being the upward or downward direction).

(8) The holding of the power storage module (power storage elements 12) of the holding member 50 is not limited to the configuration described above. For example, a configuration is possible in which locking claws are provided on the holding member, and the power storage module (power storage elements 12) are held at a predetermined position on the holding member by the locking claws locking the power storage module (power storage elements 12).

(9) The number of power storage elements 12 is not limited to the number described in the above embodiment.

(10) The heat insulating layer 42 is an air layer, but is not limited to this, and may be a resin layer or the like.

The invention claimed is:

1. An electricity storage unit comprising:
a circuit portion on which an electronic component is mounted;
a power storage element;
a holding member that holds the power storage element above the circuit portion; and
an electrically conductive heat dissipation member that dissipates heat from the circuit portion, the heat dissipation member being arranged on a side of the circuit portion that is opposite to a side of the circuit portion facing the power storage element, and being electrically connected to the holding member,
wherein the holding member includes
an electrically conductive shield wall portion between the circuit portion and the power storage element, the shield wall portion shielding noise generated by the circuit portion,
a rectangular tube-shaped housing wall that protrudes upward from a first peripheral edge portion of the shield wall portion, and
a rectangular tube-shaped peripheral wall that protrudes downward from a second peripheral edge portion of the shield wall portion with a smaller height than the housing wall,
the shield wall portion, the housing wall, and the peripheral wall being integrally formed from a metal material, and
the peripheral wall is arranged so as to surround an entire periphery of the circuit portion, the peripheral wall having a retaining portion, the retaining portion having a threaded hole open to a hole disposed on the electrically conductive heat dissipation member so as to receive a metal screw and couple both electrically and mechanically the peripheral wall to the heat dissipation member.

2. The electricity storage unit according to claim 1, wherein a heat insulating layer is formed between the shield wall portion and the electronic component that is a heat source.

3. The electricity storage unit according to claim 1, wherein the power storage element is placed on the shield wall portion.

4. The electricity storage unit according to claim 3, wherein a heat insulating layer is formed between the shield wall portion and the electronic component that is a heat source.

* * * * *